(12) United States Patent
Xue et al.

(10) Patent No.: US 9,640,568 B2
(45) Date of Patent: May 2, 2017

(54) MASK SET, PIXEL UNIT AND MANUFACTURING METHOD THEREOF, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yanna Xue, Beijing (CN); Xue Dong, Beijing (CN); Xiaochuan Chen, Beijing (CN); Hailin Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/419,745

(22) PCT Filed: Jul. 4, 2014

(86) PCT No.: PCT/CN2014/081631
§ 371 (c)(1),
(2) Date: Feb. 5, 2015

(87) PCT Pub. No.: WO2015/096449
PCT Pub. Date: Jul. 2, 2015

(65) Prior Publication Data
US 2016/0027816 A1 Jan. 28, 2016

(30) Foreign Application Priority Data

Dec. 27, 2013 (CN) .......................... 2013 1 0741648

(51) Int. Cl.
*H01L 27/12* (2006.01)
*H01L 29/417* (2006.01)
(Continued)

(52) U.S. Cl.
CPC .... *H01L 27/1288* (2013.01); *G02F 1/136286* (2013.01); *G03F 1/38* (2013.01);
(Continued)

(58) Field of Classification Search
CPC ............... H01L 27/1288; H01L 27/124; H01L 29/42384; H01L 29/78696; H01L 29/41733; G03F 1/38
(Continued)

(56) References Cited

U.S. PATENT DOCUMENTS 6,654,074 B1    11/2003  Ha et al.
6,900,854 B1 *   5/2005  Kim .................. G02F 1/134336
                                                    257/E29.068

(Continued)

FOREIGN PATENT DOCUMENTS

CN    1734791 A      2/2006
CN    101097375 A    1/2008
(Continued)

OTHER PUBLICATIONS

Korean Office Action dated May 16, 2016; Appln. No. 10-2015-7012985.
(Continued)

*Primary Examiner* — Nathan W Ha
(74) *Attorney, Agent, or Firm* — Ladas & Parry LLP (57) ABSTRACT

A mask set, a pixel unit and a manufacturing method thereof, an array substrate and a display device are provided to overcome the problem of low brightness of a display screen of a display device. In the pixel unit, the maximum size value of an overlapped area between an active layer and a
(Continued)

drain electrode of a thin-film transistor (TFT) in the direction parallel to data line is less than the size value of one side, overlapped with the data line, in an overlapped area between the active layer and a source electrode; and the source electrode is the portion of the data line disposed in an overlapped area between the active layer and the data line. The pixel unit has the advantages of a larger opening area and higher light transmittance. Thus, the brightness of a display screen of the display device comprising the pixel units can be enhanced. Moreover, the problem of screen flicker can be avoided to some extent, and hence the display quality of images can be improved.

13 Claims, 7 Drawing Sheets (51) Int. Cl.
G02F 1/1362 (2006.01)
G03F 1/38 (2012.01)
H01L 29/423 (2006.01)
H01L 29/786 (2006.01)

(52) U.S. Cl.
CPC ...... *H01L 27/124* (2013.01); *H01L 29/41733* (2013.01); *H01L 29/42384* (2013.01); *H01L 29/78696* (2013.01); *G02F 2201/40* (2013.01)

(58) Field of Classification Search
USPC .......................................... 257/72
See application file for complete search history.

(56) References Cited

U.S. PATENT DOCUMENTS

| | | |
|---|---|---|
| 2002/0051099 A1 | 5/2002 | Moon |
| 2003/0160240 A1 | 8/2003 | Okumura |
| 2004/0263706 A1* | 12/2004 | Cho ............... G02F 1/136286 349/43 |
| 2005/0161738 A1 | 7/2005 | Hiramatsu et al. |
| 2007/0241332 A1* | 10/2007 | Ochiai ............ G02F 1/133555 257/59 |
| 2007/0291195 A1* | 12/2007 | Kim ............... G02F 1/136209 349/44 |
| 2008/0001155 A1 | 1/2008 | Jung et al. |
| 2008/0001175 A1 | 1/2008 | Kim et al. |
| 2008/0180624 A1* | 7/2008 | Choi .............. G02F 1/133555 349/141 |
| 2009/0140269 A1* | 6/2009 | Song .............. G02F 1/13458 257/88 |
| 2011/0228189 A1* | 9/2011 | Oh ................ G02F 1/13338 349/43 |
| 2011/0249037 A1* | 10/2011 | Koyama .......... G02F 1/13454 345/690 |

FOREIGN PATENT DOCUMENTS

| | | |
|---|---|---|
| CN | 103715095 A | 4/2014 |
| KR | 1020010103884 A | 11/2001 |
| KR | 1020020006376 A | 1/2002 |

OTHER PUBLICATIONS

International Search Report dated Sep. 10, 2014; PCT/CN2014/081631.

Written Opinion of the International Searching Authority dated Sep. 22, 2014; PCT/CN2014/081631.

First Chinese Office Action dated Nov. 4, 2015; Appln. No. 201310741648.X.

Korean Notice of Allowance dated Jan. 25, 2017; Appln. No. 10-2015-7012985.

* cited by examiner

MASK SET, PIXEL UNIT AND MANUFACTURING METHOD THEREOF, ARRAY SUBSTRATE AND DISPLAY DEVICE

TECHNICAL FIELD

Embodiments of the present invention relate to a mask set, a pixel unit and a manufacturing method thereof, an array substrate and a display device.

BACKGROUND

An array substrate of a conventional display device generally comprises a base substrate and a plurality of parallel gate lines and a plurality of data lines vertically crossed with and electrically insulated from the gate lines, which are disposed on the inside of the base substrate. Two adjacent gate lines and two adjacent data lines are combined to define a pixel unit. Each pixel unit surrounded by two adjacent gate lines and two adjacent data lines includes a thin-film transistor (TFT) configured to drive for image display and a pixel electrode connected with the TFT.

Figure 1:
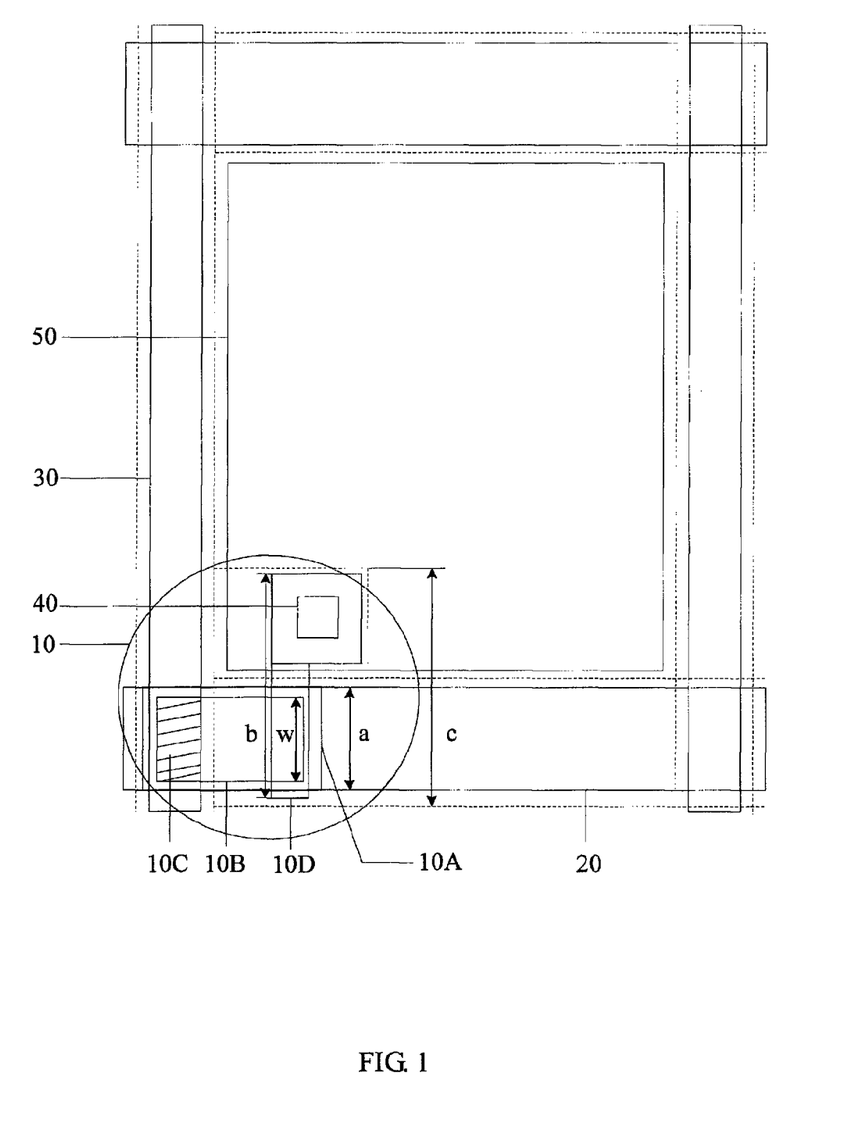
FIG. 1 is a schematic structural view of the conventional pixel unit.

Taking a TFT of a pixel unit in a bottom-gate structure as an example, as illustrated in FIG. 1, a TFT 10 of a pixel unit comprises: a gate electrode 10A disposed on a base substrate and connected with a gate line 20 of the pixel unit; an active layer 10B disposed on the gate electrode 10A; and a source electrode 10C and a drain electrode 10D disposed on the active layer 10B and respectively disposed on two sides of the active layer 10B, wherein the source electrode 10C is a portion of a data line 30 disposed in an overlapped area between the active layer 10B and the data line 30 of the pixel unit; the drain electrode 10D is partially overlapped with the active layer 10B and connected with a pixel electrode 50 of the pixel unit via a through hole 40; the gate electrode 1A, the active layer 10B and the source electrode 10C are rectangular; the gate electrode 10A completely covers the active layer 10B which completely covers the source electrode 10C; the drain electrode 10D is "P"-shaped; an overlapped area between the drain electrode 10D and the active layer 10B is rectangular; if the direction along the data line 30 is taken as the width direction, the width value of the overlapped area between the drain electrode 10D and the active layer 10B, the width value of the source electrode 10C and the width value of the active layer 10B are equal to each other and all are "w"; the width value of the gate electrode 10A is "a"; and the width value of the drain electrode 10D is "b," where w<a<b.

Currently, as for a pixel unit, a black matrix (BM) for light shielding is usually disposed on gate lines, data lines and a TFT of the pixel unit. As illustrated in FIG. 1, the black matrix covers gate lines 20, data lines 30, the gate electrode 10A, the active layer 10B, the source electrode 10C and the drain electrode 10D. If the vertical direction is taken as the width direction, supposing that a pixel unit is 60 micrometers in width and 20 micrometers in length, as illustrated in FIG. 1, the width value "c" of areas of the black matrix covering the TFT 10 of the pixel unit generally can reach 28 micrometers. That is to say, the coverage area of the black matrix in each pixel unit is relatively large, so the light transmittance is relatively low, and hence the brightness of the display screen of a display device is relatively low.

SUMMARY

At least one embodiment of the present invention provides a mask set configured to manufacture a pixel unit including a thin-film transistor (TFT) and a data line, comprising: a first mask including an active layer pattern portion configured to form an active layer of the TFT; a second mask including a gate electrode pattern portion configured to form a gate electrode of the TFT; and a third mask including a source electrode pattern portion, a drain electrode pattern portion and a data line pattern portion respectively configured to form a source electrode and a drain electrode of the TFT and the data line; when the first mask, the second mask and the third mask are aligned and overlapped with each other, a maximum size value of an overlapped area between the active layer pattern portion of the first mask and the drain electrode pattern portion of the third mask in the direction parallel to the data line pattern portion is less than a size value of one side, overlapped with the data line pattern portion, in an overlapped area between the active layer pattern portion of the first mask and the source electrode pattern portion of the second mask.

In one example, the active layer pattern portion of the first mask is a first isosceles trapezoid; and when the first mask, the second mask and the third mask are aligned and overlapped with each other, bases of the first isosceles trapezoid are disposed in the direction parallel to the data line pattern portion; an upper base of the first isosceles trapezoid is disposed in an overlapped area between the drain electrode pattern portion and the first isosceles trapezoid; and a lower base of the first isosceles trapezoid is disposed in an overlapped area between the source electrode pattern portion and the first isosceles trapezoid.

In one example, the gate electrode pattern portion of the second mask is a second isosceles trapezoid; and when the first mask, the second mask and the third mask are aligned and overlapped, the second isosceles trapezoid completely covers the first isosceles trapezoid; bases of the second isosceles trapezoid are disposed in the direction parallel to the data line pattern portion; and the upper base of the second isosceles trapezoid and the upper base of the first isosceles trapezoid are disposed on a same side.

In one example, a sum of a size value of the upper base and the lower base of the first isosceles trapezoid is equal to twice a width value of the active layer pattern portion; and the width value of the active layer pattern portion is a size value of one side of the active layer pattern portion parallel to the data line pattern portion where the active layer pattern portion is rectangular.

In one example, the second mask further includes a gate line pattern portion configured to form a gate line.

At least one embodiment of the present invention provides a method for manufacturing a pixel unit including a TFT and a data line, comprising: adopting a second mask to form a gate electrode of the TFT on a substrate; adopting a first mask to form an active layer of the TFT on the gate electrode; and adopting a third mask to form a source electrode and a drain electrode of the TFT on the active layer and form the data line, so that a maximum size value of an overlapped area between the active layer and the drain electrode of the TFT in the direction parallel to the data line is less than a size value of one side, overlapped with the data line, in an overlapped area between the active layer and the source electrode of the TFT.

In one example, before adopting the first mask to form the active layer of the TFT on the gate electrode, further comprising: forming a gate insulating layer covering the gate electrode.

At least one embodiment of the present invention provides a pixel unit, comprising a thin film transistor (TFT) and a data line, a source electrode of the TFT electrically connected with the data line, wherein a maximum size value of an overlapped area between an active layer and a drain electrode of the TFT in the direction parallel to the data line is less than a size value of one side, overlapped with the data line, in an overlapped area between the active layer and the source electrode of the TFT; and the source electrode is a portion of the data line disposed in an overlapped area between the active layer and the data line.

In one example, the active layer is a first isosceles trapezoid; bases of the first isosceles trapezoid are disposed in the direction parallel to the data line; an upper base of the first isosceles trapezoid is disposed in the overlapped area between the drain electrode and the active layer; and a lower base of the first isosceles trapezoid is disposed in an overlapped area between the source electrode and the active layer.

In one example, the gate electrode is a second isosceles trapezoid; the second isosceles trapezoid completely covers the first isosceles trapezoid; bases of the second isosceles trapezoid are disposed in the direction parallel to the data line; and an upper base of the second isosceles trapezoid and an upper base of the first isosceles trapezoid are disposed on a same side.

In one example, a sum of a size value of the upper base and the lower base of the first isosceles trapezoid is equal to twice a width value of the active layer; and the width value of the active layer is the size value of one side of the active layer parallel to the data line when the active layer is rectangular.

In one example, a gate insulating layer configured to cover the gate electrode is disposed between the gate electrode and the active layer.

At least one embodiment of the present invention provides an array substrate, comprising a plurality of pixel units, and at least one pixel unit is any aforesaid pixel unit.

At least one embodiment of the present invention provides a display device, comprising the aforesaid array substrate.

BRIEF DESCRIPTION OF THE DRAWINGS

More detailed description will be given below to the embodiments of the present invention with reference to the accompanying drawings to provide a more clear understanding of the present invention.

DETAILED DESCRIPTION

Clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention shall fall within the scope of protection of the present invention.

Unless otherwise defined, the technical terms or scientific terms used herein have normal meanings understood by those skilled in the art. The words "first", "second" and the like used in the description and the claims of the patent application of the present invention do not indicate the sequence, the number or the importance but are only used for distinguishing different components. Similarly, the words "a", "an" and the like also do not indicate the number but only indicate at least one. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

At least one embodiment of the present invention provides a pixel unit, which comprises a TFT and a data line. The maximum size value of an overlapped area between an active layer and a drain electrode of the TFT in the direction parallel to the data line is less than the size value of one side, overlapped with the data line, in an overlapped area between the active layer and a source electrode of the TFT. The source electrode is a portion of the data line disposed in an overlapped area between the active layer and the data line.

In the pixel unit provided by the embodiment of the present invention, the maximum size value of the overlapped area between the active layer and the drain electrode of the TFT in the direction parallel to the data line is less than the width value w of the overlapped area between the drain electrode and the active layer of the TFT in the pixel unit as shown in FIG. 1. Correspondingly, in the pixel unit provided by the embodiment of the present invention, the size value of an area, close to the drain electrode, of a gate electrode of the TFT in the direction parallel to the data line is less than the width value "a" of the gate electrode of the TFT in the pixel unit as shown in FIG. 1. Moreover, in the pixel unit provided by the embodiment of the present invention, the minimum size value of the drain electrode of the TFT in the direction parallel to the data line is also less than the width value "b" of the drain electrode of the TFT in the pixel unit as shown in FIG. 1. That is to say, compared with the pixel unit as shown in FIG. 1, the size value of the area, close to the drain electrode, of the TFT in the pixel unit provided by the embodiment of the present invention in the direction parallel to the data line is reduced. Thus, the size value of the black matrix covering the TFT area of the pixel unit in the direction parallel to the data line is less than the width value "c" of the black matrix covering the TFT area of the pixel unit in FIG. 1, and hence the pixel unit has a larger opening area and higher light transmittance and the brightness of a display screen of a display device comprising the pixel units is enhanced. Furthermore, the minimum size value of the drain electrode of the TFT in the pixel unit provided by the embodiment of the present invention in the direction parallel to the data line is less than the width value "b" of the drain electrode of the TFT in the pixel unit as shown in FIG. 1. Thus, the capacitance invoked by the drain electrode is reduced, and hence the problem of screen flicker due to the capacitance of the drain electrode can be avoided to some extent and the display quality of images can be improved.

In addition, in the pixel unit provided by the embodiment of the present invention, the size value of one side, overlapped with the data line, of the overlapped area between the active layer and the source electrode of the TFT is greater than the width value "w" of the source electrode of the TFT in the pixel unit as shown in FIG. 1, and the size value of the area, close to the drain electrode, of the gate electrode of the TFT in the direction parallel to the data line is greater than the width value "a" of the gate electrode of the TFT in the pixel unit as shown in FIG. 1. That is to say, compared with the pixel unit as shown in FIG. 1, the size value of the area, close to the drain electrode, of the TFT in the pixel unit provided by the embodiment of the present invention is increased in the direction parallel to the data line. As the size value of one side, overlapped with the data line, of the overlapped area between the active layer and the source electrode of the TFT is increased when the maximum size value of the overlapped area between the active layer and the drain electrode of the TFT in the direction parallel to the data line is reduced, good working performance of the TFT can be guaranteed. Because the source electrode of the TFT is an overlapped portion between the data line and the active layer of the pixel unit and the entire data line is covered by the black matrix, the size of the black matrix covering the source electrode and the gate electrode of the TFT will not change or the amplitude of change is so small that it is ignored even if the size value of the source electrode in the direction parallel to the data line is increased.

The shape of the active layer of the TFT in the pixel unit provided by the embodiments of the present invention can be implemented in various ways. Description will be given below to a plurality of implementations of the shape of the active layer in the embodiments of the present invention for example. It should be noted that the following embodiments only have difference in the shape of the active layer, so repeated description will not be given to other embodiments.

Embodiment 1

In the embodiment 1 of the present invention, the shape of an active layer of a TFT in a pixel unit is regular and is in a shape of an isosceles trapezoid.

In one example of the embodiment, an upper base and a lower base of the isosceles trapezoid of the active layer are disposed in the direction parallel to the data line; the upper base of the isosceles trapezoid is disposed in an overlapped area between a drain electrode and an active layer; the lower base of the isosceles trapezoid is disposed in an overlapped area between a source electrode and the active layer; and the size value of the upper base and the lower base of the isosceles trapezoid satisfies the performance requirement of the TFT.

It should be noted that: in the embodiments of the present invention, the short side of the isosceles trapezoid is referred to as the upper base of the isosceles trapezoid and the long side of the isosceles trapezoid is referred to as the lower base of the isosceles trapezoid.

In a specific implementation of the above example, as the active layer of the TFT is in the shape of an isosceles trapezoid, the overlapped area between the drain electrode and the active layer is in the shape of an isosceles trapezoid where bases are disposed in the direction parallel to the data line, and an upper base of the overlapped area between the drain electrode and the active layer is the upper base of the active layer; and the source electrode is in the shape of an isosceles trapezoid where bases are disposed in the direction parallel to the data line, and a lower base of the source electrode is the lower base of the active layer.

In a specific implementation, when the active layer of the TFT is of an isosceles trapezoid, a gate electrode of the TFT may adopt any shape as long as the gate electrode completely covers the active layer.

In one example, the gate electrode of the TFT is of an isosceles trapezoid; the gate electrode completely covers the active layer; an upper base and a lower base of the gate electrode are disposed in the direction parallel to the data line; and the upper base of the gate electrode and the upper base of the active layer are disposed on the same side.

In a specific implementation of the above example, the active layer of the TFT is of an isosceles trapezoid; the overlapped area between the drain electrode and the active layer of the TFT is of an isosceles trapezoid; the source electrode of the TFT is of an isosceles trapezoid; the gate electrode of the TFT is of an isosceles trapezoid; and hence the formed TFT is an isosceles trapezoid TFT.

In the pixel unit comprising the isosceles trapezoid TFT provided by the embodiment, the size value of the upper base of the active layer of the TFT, namely the size value of the upper base of the overlapped area between the drain electrode and the active layer of the TFT, is less than the width value "w" of the overlapped area between the drain electrode and the active layer of the TFT in the pixel unit as shown in FIG. 1; the size value of the upper base of the gate electrode of the TFT is less than the width value "a" of the gate electrode of the TFT in the pixel unit as shown in FIG. 1; and the size value of an area, close to the upper base of the active layer, of the drain electrode of the TFT in the vertical direction is less than the width value "b" of the drain electrode of the TFT in the pixel unit as shown in FIG. 1. That is to say, compared with the pixel unit as shown in FIG. 1, the size value of the area, close to the upper base of the active layer, of the isosceles trapezoid TFT in the pixel unit provided by the embodiment of the present invention in the vertical direction is reduced. Thus, the size value of the black matrix covering the isosceles trapezoid TFT area of the pixel unit in the vertical direction is less than the width value "c" of the black matrix covering the TFT area of the pixel unit in FIG. 1, and hence the pixel unit has a larger opening area and higher light transmittance, and the brightness of a display screen of a display device comprising the pixel units is enhanced. Moreover, as the size value of the area, close to the upper base of the active layer, of the drain electrode of the TFT in the vertical direction is less than the width value "b" of the drain electrode of the TFT in the pixel unit as shown in FIG. 1, the capacitance of the drain electrode is reduced. Thus, the problem of screen flicker due to the capacitance of the drain electrode can be avoided to some extent, and hence the display quality of images can be improved.

In addition, in the pixel unit provided by the embodiment, the TFT is an isosceles trapezoid; the size value of the lower base of the active layer of the TFT, namely the size value of the lower base of the source electrode of the TFT, is greater than the width value "w" of the source electrode of the TFT in the pixel unit as shown in FIG. 1; the size value of the upper base of the overlapped area between the drain electrode and the active layer of the TFT and the size value of the lower base of the source electrode of the TFT satisfy the performance requirements of the TFT; and the size value of the upper base of the gate electrode of the TFT is greater than the width value "a" of the gate electrode of the TFT in the pixel unit as shown in FIG. 1. That is to say, compared with the pixel unit as shown in FIG. 1, in the pixel unit provided by the embodiment of the present invention, the size value of an area, close to the lower base of the active layer, of the isosceles trapezoid TFT in the vertical direction is increased. Because the size value of the upper base of the overlapped area between the drain electrode and the active layer of the TFT and the size value of the lower base of the source electrode of the TFT satisfy the performance requirements of the TFT, good working performance of the TFT can be guaranteed. Moreover, the source electrode of the TFT is an overlapped portion between the data line and the active layer of the pixel unit; the lower base of the gate electrode of the TFT and the lower base of the source electrode of the TFT are disposed on the same side; and the entire data line is covered by a black matrix. Thus, the area size of the black matrix covering the source electrode and the gate electrode of the TFT will not be changed or the amplitude of variation is small enough to be ignored even if the size value of the lower base of the source electrode is increased.

In one example, the sum of the size values of the upper base and the lower base of the active layer is equal to twice the width value of the active layer of the TFT; the width value of the active layer is the size value of one side, parallel to the data line, in the active layer where the active layer is rectangular. In the implementation of the example, when the sum of the size values of the upper base and the lower base of the active layer is equal to twice the width value of the active layer of the TFT, the formed TFT has good working performance.

It should be noted that the TFT of the pixel unit provided by the embodiment of the present invention may be a bottom-gate TFT or may be a top-gate TFT. Detailed description will be given below to the embodiment of the present invention by taking a bottom-gate TFT as an example. As the implementation of the top-gate TFT is similar to the implementation of the bottom-gate TFT, no further description will be given here.

Figure 2A:
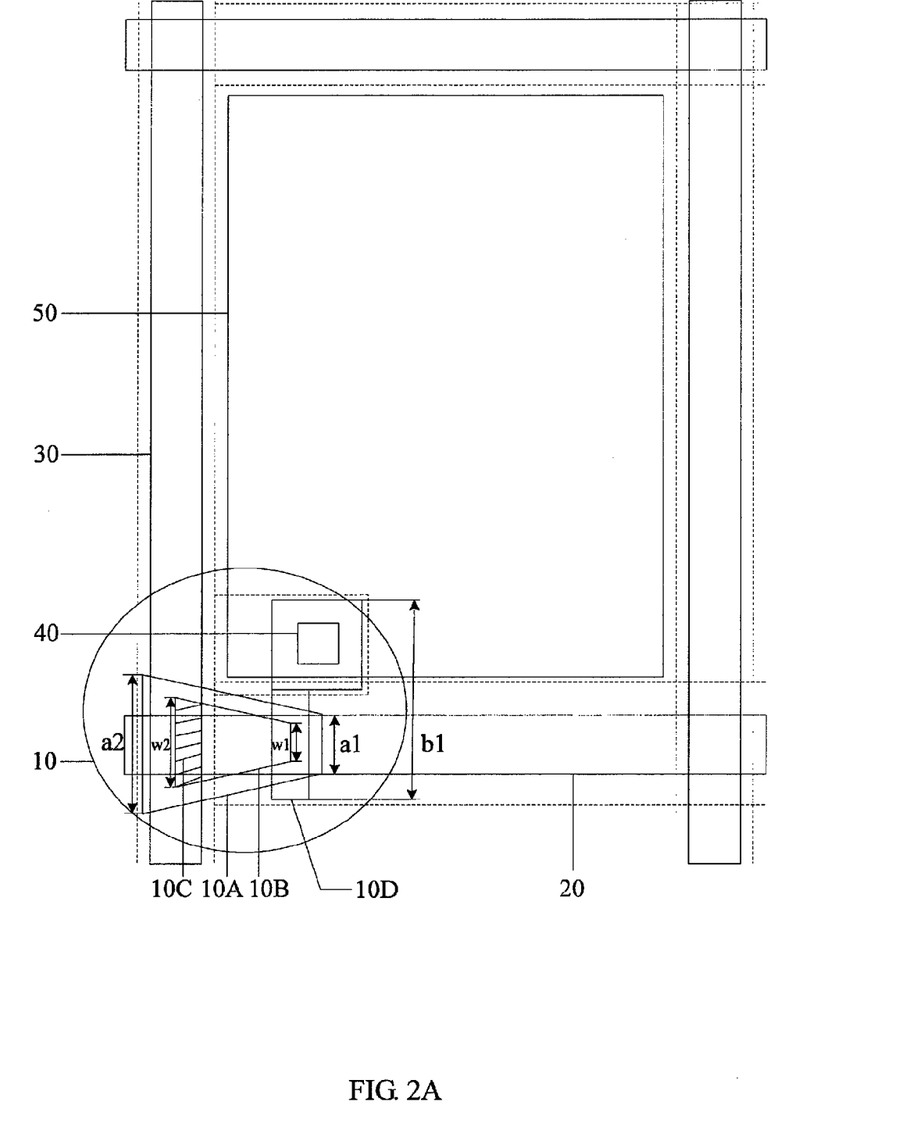
FIGS. 2A to 2E are schematic structural views of a pixel unit provided by the embodiment of the present invention.

FIG. 2A illustrates a TFT 10 in a pixel unit provided by the embodiment 1. The TFT 10 is an isosceles trapezoid TFT and comprises a gate electrode 10A, an active layer 10B disposed on the gate electrode 10A, and a source electrode 10C and a drain electrode 10D which are disposed on the active layer 10B and respectively disposed on both sides of the active layer 10B; the active layer 10B completely covers the source electrode 10C, and the drain electrode 10D and the active layer 10B are partially overlapped with each other.

In one example of the embodiment, the active layer 10B is an isosceles trapezoid; the upper base and the lower base of the active layer 10B are disposed in the vertical direction; the upper base of the active layer 10B is disposed in an overlapped area between the drain electrode 10D and the active layer 10B; and the lower base of the active layer 10B is disposed in an overlapped area between the source electrode 10C and the active layer 10B; the size value of the upper base of the active layer 10B is w1; the size value of the lower base of the active layer 10B is w2; and w1 and w2 satisfy the performance requirements of the TFT 10, and e.g., the sum of w1 and w2 is equal to twice the width value of the active layer.

In one example of the embodiment, the gate electrode 10A is an isosceles trapezoid and completely covers the active layer 10B; the upper base and the lower base of the gate electrode 10A are disposed in the vertical direction; the upper base of the gate electrode 10A and the upper base of the active layer 10B are disposed on the same side; the lower base of the gate electrode 10A and the lower base of the active layer 10B are disposed on the same side; the size value of the upper base of the gate electrode 10A is a1; and the size value of the lower base of the gate electrode 10A is a2.

In one example of the embodiment, the drain electrode 10D is "P"-shaped; the overlapped area between the drain electrode 10D and the active layer 10B is an isosceles trapezoid, an upper base and a lower base of which are disposed in the vertical direction; the upper base of the overlapped area between the drain electrode 10D and the active layer 10B is the upper base of the active layer 10B; and the lower base of the overlapped area between the drain electrode 10D and the active layer 10B is overlapped with one side of the drain electrode 10D; the size value of the upper base of the overlapped area between the drain electrode 10D and the active layer 10B is w1, and the size value of an area, close to the upper base of the active layer 10B, of the drain electrode 10D in the vertical direction is b1.

In one example of the embodiment, the source electrode 10C is an isosceles trapezoid, the bases of which are disposed in the vertical direction, and the lower base of the source electrode 10C is the lower base of the active layer 10B; the size value of the lower base of the source electrode 10C is w2.

In one example of the embodiment, the shape of the drain electrode 10D is similar to the shape of the drain electrode of the TFT in the pixel unit as shown in FIG. 1.

In another example of the embodiment, the drain electrode 10D may adopt other shape besides the "P" shape according to specific requirement or design experience.

In one example of the embodiment, a gate insulating layer configured to cover the gate electrode 10A is disposed between the gate electrode 10A and the active layer 10B.

In one example of the embodiment, the TFT may be a TFT configured to drive image display in a pixel unit of an array substrate.

As illustrated in FIG. 2A, in one example of the embodiment, the gate line 20 and the gate electrode 10A of the pixel unit are connected with each other; the data line 30 and the active layer 10B are partially overlapped; an overlapped portion of the data line 30 with the active layer 10B is the source electrode 10C; and the drain electrode 10D is connected with a pixel electrode 50 via a through hole 40.

In the pixel unit provided by the embodiment of the present invention, the TFT 10 of the pixel unit is an isosceles trapezoid, w1<w, w2>w, a1<a, a2>a, b1<b, where "w" refers to the width value of the overlapped area between the drain electrode and the active layer of the TFT in the pixel unit as shown in FIG. 1 or the width value of the source electrode; "a" refers to the width value of the gate electrode of the TFT in the pixel unit as shown in FIG. 1; and "b" refers to the width value of the drain electrode of the TFT in the pixel unit as shown in FIG. 1.

As mentioned above, in the pixel unit provided by the embodiment, w1=w, a1<a, b1<b. That is to say, compared with the pixel unit as shown in FIG. 1, the size value of an area, close to the upper base of the active layer, of the isosceles trapezoid TFT 10 in the vertical direction is reduced. Thus, the size value of the black matrix covering the area of the isosceles trapezoid TFT 10 of the pixel unit in the vertical direction is less than the width value "c" of the black matrix covering the TFT area of the pixel unit, and hence the pixel unit has a larger opening area and higher light transmittance, and the brightness of the display screen of the display device comprising the pixel units is enhanced. Moreover, as b1<b, the capacitance of the drain electrode is reduced. Thus, the problem of screen flicker due to the capacitance of the drain electrode can be avoided to some extent, and hence the display quality of images can be improved. In addition, as w2>w and w1 and w2 satisfy the performance requirements of the TFT 10, good working performance of the TFT can be guaranteed. Furthermore, the source electrode of the TFT is the overlapped portion between the data line and the active layer of the pixel unit; the lower base of the gate electrode of the TFT and the lower base of the source electrode of the TFT are disposed on the same side; and the entire data line is covered by the black matrix. Thus, the size of the black matrix covering the source electrode and the gate electrode of the TFT will not be changed or the amplitude of variation is small enough to be ignored even if w2>w and a2>a.

In one example, the sum of the size values of the upper base and the lower base of the active layer 10B (namely w1+w2) is equal to twice the width value (namely w) of the active layer. That is to say, the difference between the width value w of the active layer and the size value w1 of the upper base of the active layer 10B is equal to the difference between the size value w2 of the lower base of the active layer 10B and the width value w of the source electrode. In the example, good working performance of the formed TFT in the pixel unit can be guaranteed when w1+w2=2w.

It should be noted that: in one example of the embodiment 1 of the present invention, the upper base and the lower base of the active layer are parallel to the data line; but in other examples, the upper base and the lower base of the active layer may also be not parallel to the data line.

Embodiment 2

In the embodiment 2 of the present invention, the shape of the active layer of a TFT in a pixel unit is regular and adopts a simple deformation of an isosceles trapezoid, namely a shape similar to the isosceles trapezoid.

In one example of the embodiment, at least one side of the shape of the active layer is of a curve, e.g., a smooth curve.

Figure 2B:
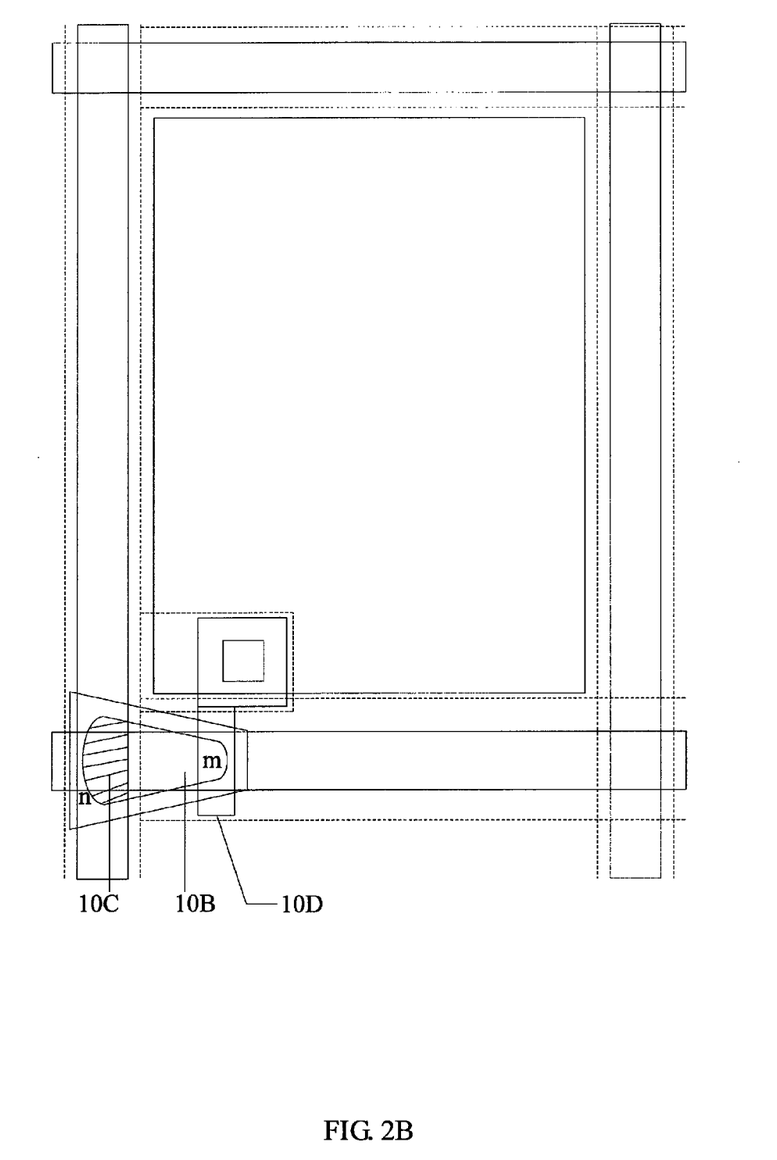

In one example, as illustrated in FIG. 2B, one side (namely side m) of the active layer 10B disposed in the overlapped area between the active layer 10B and the drain electrode 10D and one side (namely side n) of the active layer 10B disposed in an overlapped area between the active layer 10B and the source electrode 10C are smooth curves.

Figure 2C:
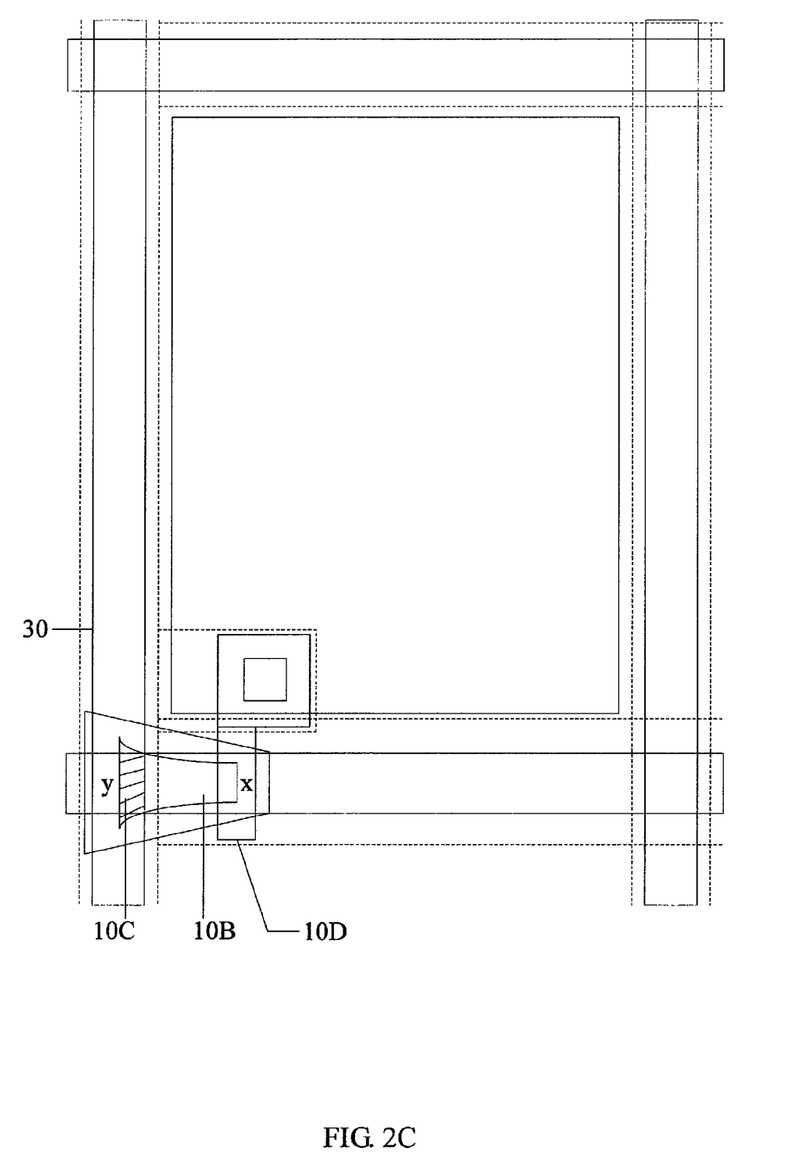

In another example, as illustrated in FIG. 2C, two sides (namely sides x and y) of the active layer 10B, overlapped with data line 30 and the drain electrode 10D simultaneously, are smooth curves.

It should be noted that in other examples of the embodiment, at least one side of the shape of the active layer may be a non-smooth curve, e.g., a line comprising a straight line or a curve line, a wave line or a sawtooth line.

The shape of a gate electrode in the embodiment of the present invention is similar to the shape of the gate electrode in the embodiment 1, and the shape may be any shape covering the source electrode.

Embodiment 3

In the embodiment 3 of the present invention, the shape of an active layer of a TFT in a pixel unit is regular and is a trapezoid other than an isosceles trapezoid.

Figure 2D:
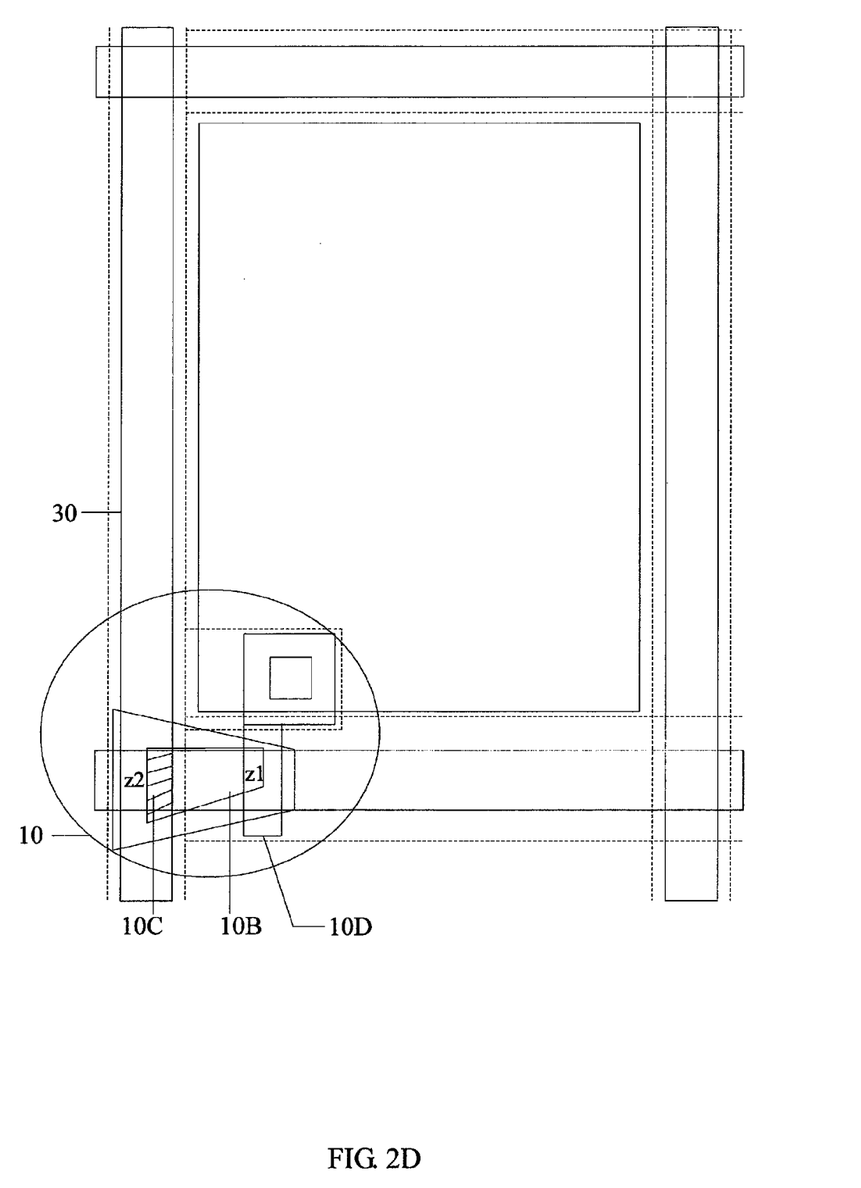

In one example, as illustrated in FIG. 2D, an active layer 10B is a right trapezoid; the upper base and the lower base of the active layer 10B are disposed in the direction parallel to the data line 30; the upper base of the active layer 10B is disposed in an overlapped area between the drain electrode 10D and the active layer 10B; and the lower base of the active layer 10B is disposed in an overlapped area between the source electrode 10C and the active layer 10B; the size value of the upper base of the active layer 10B is z1; the size value of the lower base of the active layer 10B is z2; and z1 and z2 satisfy the performance requirements of the TFT 10, e.g., the sum of z1 and z2 is equal to twice the width value of the active layer 10B.

It should be noted that: as similar to the embodiment 2 of the present invention, the shape of the active layer in the embodiment 3 of the present invention may be any shape similar to the right trapezoid. No further description will be given here.

The shape of a gate electrode in the embodiment 3 of the present invention is similar to the shape of the gate electrode in the embodiment 1. The gate electrode may adopt any shape covering the source electrode. No further description will be given here.

Embodiment 4

In the embodiment 4 of the present invention, the shape of an active layer of a TFT in a pixel unit is irregular.

Figure 2E:
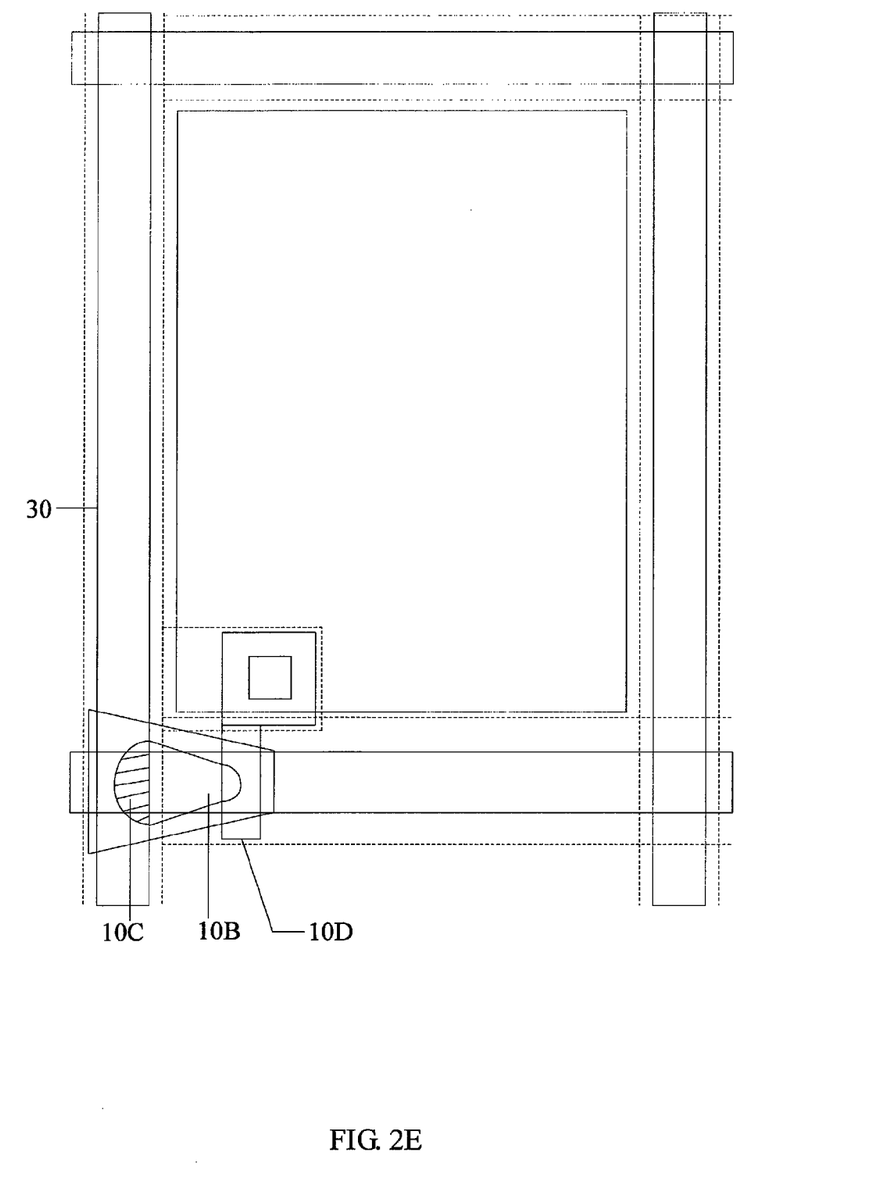

In one example, as illustrated in FIG. 2E, the shape of an overlapped area between an active layer 10B and a drain electrode 10D is the combination of a straight line and a curve; the shape of an overlapped area between the active layer 10B and a source electrode 10C is the combination of a straight line and a curve; and the shape of other areas of the active layer 10B is an isosceles trapezoid; the maximum size value of the overlapped area between the active layer 10B and the drain electrode 10D in the direction parallel to the data line 30 is less than the size value of one side, overlapped with the data line 30, in the overlapped area between the active layer 10B and the source electrode 10C.

It should be noted that: the embodiment 4 of the present invention only provides an implementation where the shape of the active layer is irregular; but in actual applications, any example, the shape of which the active layer is irregular, is applicable to the embodiment of the present invention as long as the shape of the active layer satisfies the following condition: the maximum size value of the overlapped area between the active layer and the drain electrode in the direction parallel to the data line is less than the size value of one side, overlapped with the data line, of the overlapped area between the active layer and the source electrode.

The shape of the gate electrode in the embodiment 4 of the present invention is similar to the shape of the gate electrode in the embodiment 1. The gate electrode may adopt any shape covering the source electrode. No further description will be given here.

At least one embodiment of the present invention further provides an array substrate, which comprises a plurality of pixel units; at least one pixel unit includes the TFT provided by the embodiment of the present invention and a pixel electrode connected with the TFT.

At least one embodiment of the present invention further provides a display device, which comprises the array substrate provided by the embodiment of the present invention.

The display device provided by the embodiment of the present invention may be any product or component with display function such as a liquid crystal display (LCD) panel, e-paper, an organic light-emitting diode (OLED) panel, a mobile phone, a tablet PC, a TV, a display, a notebook computer, a digital picture frame and a navigator.

On the basis of the same invention concept, at least one embodiment of the present invention further provides a method for manufacturing the array substrate and a mask set configured to manufacture the pixel unit. As the principles to solve the problem of the method for manufacturing the pixel unit and the mask set configured to manufacture the pixel unit are similar to those of the pixel unit provided by the embodiment of the present invention, the implementation of the method for manufacturing the pixel unit and the mask set configured to manufacture the pixel unit may refer to the description of the pixel unit provided by the embodiment of the present invention. No repeated description will be given here. That is to say, the TFT is applied to the array substrate and taken as a switching element of the pixel unit and is electrically connected with the data line and the pixel electrode.

In one embodiment of the present invention, the mask set configured to manufacture the pixel unit comprises: a first mask configured to manufacture the active layer of the TFT; a second mask configured to manufacture the gate electrode and the gate lines of the TFT; and a third mask configured to manufacture the source electrode, the drain electrode and the data line of the TFT. Thus, the first mask includes an active layer pattern portion configured to manufacture the active layer; the second mask includes a gate electrode pattern portion configured to manufacture the gate electrode; and the third mask includes a source electrode pattern portion, a drain electrode pattern portion and a data line pattern portion which are respectively configured to manufacture the source electrode, the drain electrode and the data line. The second mask may also include a gate line pattern portion configured to manufacture the gate line.

In the use process, the first mask, the second mask and the third mask are respectively subjected to patterning process and are aligned by, for instance, alignment marks, so that the patterns are formed at default positions, and hence the pattern portions on the masks have corresponding position relationships. Or when the first mask, the second mask and the third mask are aligned and overlapped, the positions of the pattern portions formed thereon correspond to the positions of the active layer, the gate electrode, the drain electrode, the source electrode and corresponding gate line and data line of the formed TFT.

The patterning processes, for instance, include: coating one photoresist layer; adopting a mask to expose photoresist; developing the exposed photoresist to obtain a photoresist mask; and adopting a photoresist mask for etching.

The first mask, the second mask and the third mask are configured so that the maximum size value of the overlapped area between the active layer and the drain electrode of the formed TFT of the pixel unit in the direction parallel to the formed data line is less than the size value of one side, overlapped with the data line, of the overlapped area between the active layer and the source electrode of the TFT, and the source electrode is the portion of the data line disposed in the overlapped area between the active layer and the data line. Therefore, when the first mask, the second mask and the third mask are aligned and overlapped with each other, the maximum size value of the overlapped area between the active layer pattern portion of the first mask and the drain electrode pattern portion of the third mask in the direction parallel to the data line pattern portion is less than the size value of one side, overlapped with the data line pattern portion, in an overlapped area between the active layer pattern portion of the first mask and the source electrode pattern portion of the second mask.

In one example, the active layer pattern portion of the first mask is a first isosceles trapezoid; the upper base and the lower base of the first isosceles trapezoid are disposed in the direction parallel to the data line pattern portion of the third mask; the upper base of the first isosceles trapezoid is disposed in an overlapped area between the drain electrode pattern portion of the third mask and the first isosceles trapezoid; and the lower base of the first isosceles trapezoid is disposed in an overlapped area between the source electrode pattern portion of the third mask and the first isosceles trapezoid; the size value of the upper base and the lower base of the first isosceles trapezoid satisfies the performance requirements of the TFT. For instance, in one example, the sum of the size value of the upper base and the lower base of the first isosceles trapezoid is equal to twice the width value of the active layer of the TFT; the width value of the active layer is the size value of one side, parallel to the data line, in the active layer when the active layer is rectangular.

In one example, the gate electrode pattern portion of the second mask covers the active layer pattern portion of the first mask.

For instance, when the active layer pattern portion of the first mask is a first isosceles trapezoid, the gate electrode pattern portion of the second mask is a second isosceles trapezoid which completely covers the first isosceles trapezoid; bases of the second isosceles trapezoid are disposed in the direction parallel to the data line; and the upper base of the second isosceles trapezoid and the upper base of the first isosceles trapezoid are disposed on the same side.

In other examples, the active layer pattern portion of the first mask and the gate electrode pattern portion of the second mask in the TFT may also adopt other shapes. Specific details may refer to related foregoing description of the pixel unit. No further description will be given here.

Figure 3:
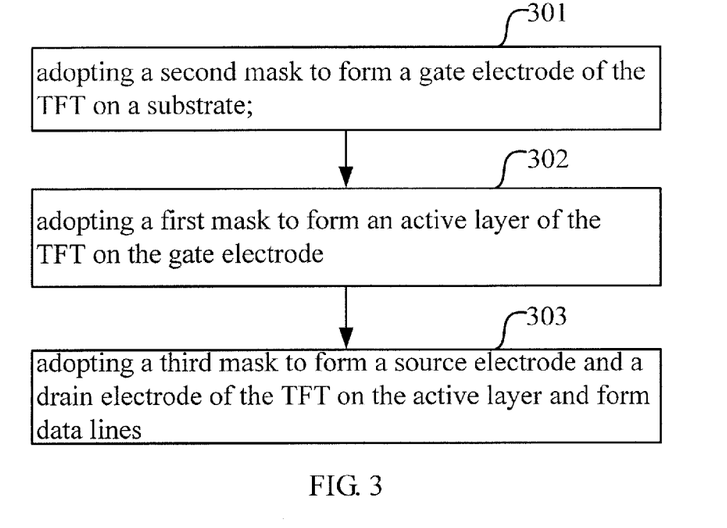
FIG. 3 is a schematic flow sheet of a method for manufacturing a pixel unit, provided by the embodiment of the present invention.

As illustrated in FIG. 3, at least one embodiment of the present invention further provides a method for adopting the masks to manufacture the pixel unit including the TFT and the data line, which comprises the following steps.

step 301: adopting the second mask to form the gate electrode of the TFT on a substrate;

step 302: adopting the first mask to form the active layer of the TFT on the gate electrode; and step 303: adopting the third mask to form the source electrode and the drain electrode of the TFT on the active layer and form the data line, so that the maximum size value of the overlapped area between the active layer and the drain electrode of the TFT in the direction parallel to the data line is less than the size value of one side, overlapped with the data line, of the overlapped area between the active layer and the source electrode of the TFT.

In one example, the step 301 further includes the step of adopting the second mask to form the gate line.

In one example, before the step 302, the method further comprises: forming a gate insulating layer covering the gate electrode.

The foregoing embodiments are only intended to illustrate the present invention but not intended to limit the present invention. Various changes and deformations may also be made by those skilled in the art without departing from the spirit and scope of the present invention. Thus, all the equivalent technical proposals should also fall within the scope of the present invention. The scope of protection of the present invention should be defined by the appended claims.

The application claims priority to the Chinese patent application No. 201310741648.X mask set, TFT and manufacturing method thereof, array substrate and display device", submitted on Dec. 27, 2013. The disclosure of the application is entirely incorporated herein by reference.

The invention claimed is:

1. A mask set configured to manufacture a pixel unit including a thin-film transistor (TFT) and a data line, comprising:
a first mask including an active layer pattern portion configured to form an active layer of the TFT;
a second mask including a gate electrode pattern portion configured to form a gate electrode of the TFT; and
a third mask including a source electrode pattern portion, a drain electrode pattern portion and a data line pattern portion respectively configured to form a source electrode and a drain electrode of the TFT and the data line, wherein when the first mask, the second mask and the third mask are aligned and overlapped with each other, a maximum size value of an overlapped area between the active layer pattern portion of the first mask and the drain electrode pattern portion of the third mask in the direction parallel to the data line pattern portion is less than a size value of one side, overlapped with the data line pattern portion, in an overlapped area between the active layer pattern portion of the first mask and the source electrode pattern portion of the second mask;

wherein the active layer pattern portion of the first mask is a first isosceles trapezoid; and when the first mask, the second mask and the third mask are aligned and overlapped with each other, bases of the first isosceles trapezoid are disposed in the direction parallel to the data line pattern portion; an upper base of the first isosceles trapezoid is disposed in an overlapped area between the drain electrode pattern portion and the first isosceles trapezoid; and a lower base of the first isosceles trapezoid is disposed in an overlapped area between the source electrode pattern portion and the first isosceles trapezoid.

2. The mask set according to claim 1, wherein the gate electrode pattern portion of the second mask is a second isosceles trapezoid; and when the first mask, the second mask and the third mask are aligned and overlapped, the second isosceles trapezoid completely covers the first isosceles trapezoid; bases of the second isosceles trapezoid are disposed in the direction parallel to the data line pattern portion; and the upper base of the second isosceles trapezoid and the upper base of the first isosceles trapezoid are disposed on a same side.

3. The mask set according to claim 1, wherein a sum of a size value of the upper base and the lower base of the first isosceles trapezoid is equal to twice a width value of the active layer pattern portion; and the width value of the active layer pattern portion is a size value of one side of the active layer pattern portion parallel to the data line pattern portion where the active layer pattern portion is rectangular.

4. The mask set according to claim 1, wherein the second mask further includes a gate line pattern portion configured to form a gate line.

5. The mask set according to claim 2, wherein a sum of a size value of the upper base and the lower base of the first isosceles trapezoid is equal to twice a width value of the active layer pattern portion; and the width value of the active layer pattern portion is a size value of one side of the active layer pattern portion parallel to the data line pattern portion where the active layer pattern portion is rectangular.

6. A method for manufacturing a pixel unit including a TFT and a data line, comprising:

adopting a second mask to form a gate electrode of the TFT on a substrate; adopting a first mask to form an active layer of the TFT on the gate electrode; and adopting a third mask to form a source electrode and a drain electrode of the TFT on the active layer and form the data line, so that a maximum size value of an overlapped area between the active layer and the drain electrode of the TFT in the direction parallel to the data line is less than a size value of one side, overlapped with the data line, in an overlapped area between the active layer and the source electrode of the TFT, wherein the active layer pattern portion of the first mask is a first isosceles trapezoid; and when the first mask, the second mask and the third mask are aligned and overlapped with each other, bases of the first isosceles trapezoid are disposed in the direction parallel to the data line pattern portion; an upper base of the first isosceles trapezoid is disposed in an overlapped area between the drain electrode pattern portion and the first isosceles trapezoid; and a lower base of the first isosceles trapezoid is disposed in an overlapped area between the source electrode pattern portion and the first isosceles trapezoid.

7. The method according to claim 6, before adopting the first mask to form the active layer of the TFT on the gate electrode, further comprising: forming a gate insulating layer covering the gate electrode.

8. A pixel unit, comprising a thin film transistor (TFT) and a data line, a source electrode of the TFT electrically connected with the data line, wherein a maximum size value of an overlapped area between an active layer and a drain electrode of the TFT in the direction parallel to the data line is less than a size value of one side, overlapped with the data line, in an overlapped area between the active layer and the source electrode of the TFT; and the source electrode is a portion of the data line disposed in an overlapped area between the active layer and the data line, wherein the active layer is a first isosceles trapezoid; bases of the first isosceles trapezoid are disposed in the direction parallel to the data line; an upper base of the first isosceles trapezoid is disposed in the overlapped area between the drain electrode and the active layer; and a lower base of the first isosceles trapezoid is disposed in an overlapped area between the source electrode and the active layer.

9. The pixel unit according to claim 8, wherein the gate electrode is a second isosceles trapezoid, the second isosceles trapezoid completely covers the first isosceles trapezoid; bases of the second isosceles trapezoid are disposed in the direction parallel to the data line; and an upper base of the second isosceles trapezoid and an upper base of the first isosceles trapezoid are disposed on a same side.

10. The pixel unit according to claim 8, wherein a sum of a size value of the upper base and the lower base of the first isosceles trapezoid is equal to twice a width value of the active layer; and the width value of the active layer is the size value of one side of the active layer parallel to the data line when the active layer is rectangular.

11. The pixel unit according to claim 8, wherein a gate insulating layer configured to cover the gate electrode is disposed between the gate electrode and the active layer.

12. The pixel unit according to claim 9, wherein a sum of a size value of the upper base and the lower base of the first isosceles trapezoid is equal to twice a width value of the active layer; and the width value of the active layer is the size value of one side of the active layer parallel to the data line when the active layer is rectangular.

13. The pixel unit according to claim 9, wherein a gate insulating layer configured to cover the gate electrode is disposed between the gate electrode and the active layer.

* * * * *